(12) United States Patent
Iwaki et al.

(10) Patent No.: US 6,984,823 B2
(45) Date of Patent: Jan. 10, 2006

(54) ELECTRON MICROSCOPE AND METHOD FOR CONTROLLING FOCUS POSITION THEREOF

(75) Inventors: Masaya Iwaki, Wako (JP); Norio Baba, Tokyo-To (JP)

(73) Assignee: Riken, Saitama-ken (JP)

( * ) Notice: Subject to any disclaimer, the term of this patent is extended or adjusted under 35 U.S.C. 154(b) by 50 days.

(21) Appl. No.: 10/480,535

(22) PCT Filed: Jun. 10, 2002

(86) PCT No.: PCT/JP02/05749

§ 371 (c)(1),
(2), (4) Date: Dec. 12, 2003

(87) PCT Pub. No.: WO02/103744

PCT Pub. Date: Dec. 27, 2002

(65) Prior Publication Data

US 2004/0174588 A1 Sep. 9, 2004

(30) Foreign Application Priority Data

Jun. 15, 2001 (JP) ...................................... 2001-182060

(51) Int. Cl.
*H01J 37/21* (2006.01)
*H01J 37/153* (2006.01)

(52) U.S. Cl. ........................ 250/311; 250/307; 250/310; 250/398

(58) Field of Classification Search ................. 250/311, 250/307, 310, 398, 396 R, 396 ML
See application file for complete search history.

(56) References Cited

U.S. PATENT DOCUMENTS

| 3,504,176 A | | 3/1970 | Thon et al. |
| 5,300,776 A | * | 4/1994 | Krivanek .................... 250/307 |
| 5,654,547 A | | 8/1997 | Coene et al. |
| 6,067,164 A | | 5/2000 | Onoguchi et al. |
| 6,140,644 A | * | 10/2000 | Kawanami et al. ......... 250/310 |
| 6,274,876 B1 | * | 8/2001 | Kawanami et al. ......... 250/307 |

FOREIGN PATENT DOCUMENTS

| JP | 9-82257 A | 3/1997 |
| JP | 2000-311645 A | 11/2000 |
| JP | 2000-331637 A | 11/2000 |

* cited by examiner

*Primary Examiner*—Jack I. Berman
(74) *Attorney, Agent, or Firm*—Birch, Stewart, Kolasch & Birch, LLP

(57) ABSTRACT

There are provided an electron microscope capable of carrying out focusing and astigmatism correction without depending on characteristics of a sample, and a method for controlling its focus position.

The electron microscope according to the present invention comprises: an electron optical system (2); a focus control part (3); an image detecting part (4); a first operating part (11) for mutually dividing first and second transformed images (9) and (10), which are obtained by carrying out the fast Fourier transform of first and second images (7) and (8) detected at two focus positions of a first focus position (f1) and a second focus position (f2) shifted from the first focus position by a known focus shifted quantity $\Delta f$, to obtain a measured divided quantity Rexp; divided quantity data (12) previously prepared and stored as a function of focus positions and spatial frequencies as a set of theoretical divided quantities, the theoretical divided quantities being obtained by substituting the two focus positions shifted by the focus shifted quantity $\Delta f$ for an image transfer function (r,f) to obtain first and second transfer function values K(r;f) and (r;f+$\Delta f$) to mutually divide the first and second transfer function values K(r;f1) and (r;f+$\Delta f$) on a spatial frequency plane; and a second operating part (13) for making a reference to the divided quantity data (12) to derive a theoretical divided quantity K(r;f0) correlating to the measured divided quantity Rexp, and for deriving a focus position f0 corresponding to the derived theoretical divided quantity K(r;f0)/K(r;f0+$\Delta f$) as a first focus position f1.

12 Claims, 8 Drawing Sheets

FIG. 10

ELECTRON MICROSCOPE AND METHOD FOR CONTROLLING FOCUS POSITION THEREOF

TECHNICAL FIELD

The present invention relates generally to an electron microscope and a method for controlling the focus position thereof. More specifically, the invention relates to an electron microscope capable of automatically correcting its focus position and astigmatism, and a method for controlling the focus position.

BACKGROUND ART

In a case where the electron optical system of an electron microscope is intended to be automatically adjusted, it is not easy to carry out automation similar to the automatic focusing function of general purpose optical cameras, video cameras or the like. The main reasons for this include (1) problems on S/N ratio and (2) aberration characteristics.

The S/N ratio of electron microscope images is low unlike general images, so that the processing of the differential system of picture signals does not function. If an image having a high S/N ratio is intended to be obtained, the dose of electron beams must be increased. However, the irradiation damage of a sample causes a problem, so that the adjusting method for acquiring many images further increases this problem. In addition, a high resolution must be achieved. Finally, even if the S/N ratio is low, the processing of the differential system of picture signals must function. This makes the automatic adjusting method difficult.

The specific aberration characteristics of electron microscopes also make the adjusting method difficult. In general purpose optical cameras, only the focus may be adjusted. However, in the optical systems of electron microscopes, astigmatism correction must be also adjusted in addition thereto. Since there are two adjusting quantities (with respect to x and y directions) in the adjustment of astigmatism correction, the adjusting method is further complicated, so that it is difficult to carry out the adjusting method. In addition, unlike optical lens systems, spherical aberration can not be corrected except for very special cases. Particularly in high resolution electron microscopes, optimum conditions can not be obtained on a so-called Gaussian plane. This also makes the adjusting method difficult.

Thus, the electron optical system can not easily adjusted, so that it is desired to automate the adjustment of the electron optical system.

In conventional three-dimensional electron microscopes, it is required to acquire many images in order to automatically adjust the electron optical system. Naturally, it is required to obtain precise series images under the same optimum optical conditions, so that there is a problem in that this is complicated and is not easily achieved.

Moreover, when obtained electron microscope images are utilized for carrying out focusing in conventional electron microscopes, electron microscope images are naturally reflected in characteristics of samples, such as compositions and shapes, so that it is not possible to recognize electron optical states from which characteristics of the samples are abstracted. For that reason, there is a problem in that it is not possible to precisely carry out focusing since the degree of focusing depends on characteristics themselves of the samples.

In addition, if astigmatism exists, it is required to correct astigmatism by a so-called stigmater while it is not possible to precisely carry out focusing.

DISCLOSURE OF THE INVENTION

It is therefore an object of the present invention to eliminate the above described problems in the prior art and to provide an electron microscope capable of simply, surely and automatically adjusting electron optical parameters, such as precise focusing and astigmatism correction, and a method for controlling its focus position.

In order to accomplish the above described object, according to one aspect of the present invention, an electron microscope comprises: an electron optical system for conducting an electron beam to a sample; a focus control part for controlling a focus position of the electron optical system with respect to the sample; an image detecting part for detecting an image caused by the electron beam aimed at the sample; first operating means for spatial frequency changing each of first and second images, which are detected by the image detecting part at two focus positions of a first focus position and a second focus position which is a focus shifted from the first focus position and which is realized by changing a predetermined physical quantity by a known quantity, to obtain first and second transformed images to mutually divide the first and second transformed images on a spatial frequency plane to derive a measured divided quantity indicative of divided results as a function of a spatial frequency; divided quantity data previously prepared as a function of focus positions and spatial frequencies as a set of theoretical divided quantities, the theoretical divided quantities being obtained by deriving an image transfer function with respect to the electron optical system as a function of focus positions and spatial frequencies, substituting the two physical quantities, which are shifted from each other by the known quantity, for the image transfer function to obtain first and second transfer function values to mutually divide the first and second transfer function values on a spatial frequency plane; and second operating means for making a reference to the divided quantity data to derive the theoretical divided quantities, wherein functional characteristics with respect to a spatial frequency correlate to the measured divided quantity, and for deriving a focus position corresponding to the derived theoretical divided quantity as the first focus position, wherein the focus position of the electron optical system is controlled by the focus control part on the basis of the operated results of the second operating means.

The predetermined physical quantity may be a focus position, and the known quantity may be a focus shifted quantity between the first and second focus positions.

The first operating means may average the divided results to derive the measured divided quantity as a function of a one-dimensional spatial frequency.

The first operating means may divide the divided results into sections of a range of values of spatial frequencies to average them every one of the sections to derive the measured divided value as a one-dimensional spatial frequency every one of the sections, and the second operating means may make a reference to the divided quantity data to derive the theoretical divided quantity, in which functional characteristics with respect to a spatial frequency correlate to the measured divided quantity, every one of the sections to derive an average theoretical divided quantity of maximum and minimum theoretical divided quantities of the theoretical divided quantities derived every one of the sections, to derive a focus position corresponding to the average theoretical divided quantity as the first focus position. The electron microscope may further comprise a stigmater for correcting astigmatism, and astigmatism may be corrected by the stigmater.

According to another aspect of the present invention, an electron microscope comprises: an electron optical system for conducting an electron beam to a sample; an astigmatism control part for controlling astigmatism of the electron optical system with respect to the sample; an image detecting part for detecting an image caused by the electron beam aimed at the sample; first operating means for spatial frequency changing each of first and second images, which are detected by the image detecting part at two astigmatism quantity of a first astigmatism quantity and a second astigmatism quantity which is an astigmatism quantity shifted from the first astigmatism quantity and which is realized by changing a predetermined physical quantity by a known quantity, to obtain first and second transformed images to mutually divide the first and second transformed images on a spatial frequency plane to derive a measured divided quantity indicative of divided results as a function of a spatial frequency; divided quantity data previously prepared as a function of astigmatism quantities and spatial frequencies as a set of theoretical divided quantities, the theoretical divided quantities being obtained by deriving an image transfer function with respect to the electron optical system as a function of astigmatism quantities and spatial frequencies, substituting the two physical quantities, which are shifted from each other by the known quantity, for the image transfer function to obtain first and second transfer function values to mutually divide the first and second transfer function values on a spatial frequency plane; and second operating means for making a reference to the divided quantity data to derive the theoretical divided quantities, wherein functional characteristics with respect to a spatial frequency correlate to the measured divided quantity, and for deriving an astigmatism quantity corresponding to the derived theoretical divided quantity as the first astigmatism quantity, wherein the astigmatism quantity of the electron optical system is controlled by the astigmatism control part on the basis of the operated results of the second operating means.

According to a further aspect of the present invention, there is provided a method for controlling a focus position of an electron microscope, the method comprising: a step of conducting an electron beam to a sample; a first operating step of spatial frequency changing each of first and second images, which are detected by an image detecting part at two focus positions of a first focus position and a second focus position, which is a focus shifted from the first focus position and which is realized by changing a predetermined physical quantity by a known quantity, to obtain first and second transformed images to mutually divide the first and second transformed images on a spatial frequency plane to derive a measured divided quantity indicative of divided results as a function of a spatial frequency, when an image caused by the electron beam aimed at the sample is detected by the image detecting part; a second operating step of deriving an image transfer function with respect to the electron optical system as a function of a focus position and a spatial frequency, to substitute the two physical quantities, which are shifted from each other by the known quantity, for the image transfer function to obtain first and second transfer function values to mutually divide the first and second transfer function values on a spatial frequency plane, to obtain theoretical divided quantities to make a reference to divided quantity data, which are previously prepared as a function of a focus position and a spatial frequency as a set of the theoretical divided quantities, to derive a focus position corresponding to the derived theoretical divided quantities as the first focus position; and a step of controlling the focus position of the electron optical system by a focus control part, which is provided for controlling the focus position of the electron optical system with respect to the sample, on the basis of the results of operation at the second operating step.

In the method for controlling a focus position of an electron microscope, the predetermined physical quantity may be a focus position, and the known quantity may be a focus shifted quantity between the first and second focus positions.

The first operating means may average the divided results to derive the measured divided quantity as a function of a one-dimensional spatial frequency.

The first operating means may divide the divided results into sections of a range of values of spatial frequencies to average them every one of the sections to derive the measured divided value as a one-dimensional spatial frequency every one of the sections, and the second operating means may make a reference to the divided quantity data to derive the theoretical divided quantity, in which functional characteristics with respect to a spatial frequency correlate to the measured divided quantity, every one of the sections to derive an average theoretical divided quantity of maximum and minimum theoretical divided quantities of the theoretical divided quantities derived every one of the sections, to derive a focus position corresponding to the average theoretical divided quantity as the first focus position. The astigmatism may be corrected by a stigmater.

According to a still further aspect of the present invention, there is provided a method for controlling an astigmatism quantity of an electron microscope, the method comprising: a step of conducting an electron beam to a sample; a first operating step of spatial-frequency-changing each of first and second images, which are detected by an image detecting part at two astigmatism quantities of a first astigmatism quantity and a second astigmatism quantity, which is an astigmatism quantity shifted from the first astigmatism quantity and which is realized by changing a predetermined physical quantity by a known quantity, to obtain first and second transformed images to mutually divide the first and second transformed images on a spatial frequency plane to derive a measured divided quantity indicative of divided results as a function of a spatial frequency, when an image caused by the electron beam aimed at the sample is detected by the image detecting part; a second operating step of deriving an image transfer function with respect to the electron optical system as a function of an astigmatism quantity and a spatial frequency, to substitute the two physical quantities, which are shifted from each other by the known quantity, for the image transfer function to obtain first and second transfer function values to mutually divide the first and second transfer function values on a spatial frequency plane, to obtain theoretical divided quantities to make a reference to divided quantity data, which are previously prepared as a function of an astigmatism quantity and a spatial frequency as a set of the theoretical divided quantities, to derive an astigmatism quantity corresponding to the derived theoretical divided quantities as the first astigmatism quantity; and a step of controlling the astigmatism quantity of the electron optical system by a focus control part, which is provided for controlling the astigmatism quantity of the electron optical system with respect to the sample, on the basis of the results of operation at the second operating step.

In the above described invention, the first and second two images are detected at two focus positions, which are realized by changing the physical quantity, such as a focus position, to compare the detected results with theoretical data to recognize the electron optical state of the electron microscope to automatically adjust the focus position and/or focusing in the presence of astigmatism. Each of the first and second images obtained at the first and second two focus positions is spatial frequency changed to obtain first transformed images to mutually divide the first and second transformed images on the spatial frequency plane, so that it is possible to eliminate the sample function $O(x,y)$ depending the kind of the sample. The measured divided quantity is expressed by information on only the electron optical state of the electron optical system without depending on characteristics of various spatial frequencies of the samples themselves, which are capable of being possessed by various samples. As a result, it is possible to precisely carry out focusing and astigmatism correction without depending on characteristics of samples.

The same technique as that for detecting the first and second two images at two focus positions, which are realized by changing the predetermined physical quantity by the known quantity, to compare the detected results with theoretical data to recognize the electron optical state of the electron microscope to automatically adjust the focus position can be applied for detecting first and second two images at two astigmatism quantities, which are realized by changing a predetermined physical quantity by a known quantity, to compare the detected results with theoretical data to recognize the electron optical state of the electron microscope to automatically astigmatism quantity.

BRIEF DESCRIPTION OF THE DRAWINGS

FIGS. 4(a-1) and 4(b-1) are diagrams showing a measured divided quantity Rexp (a) in the absence of astigmatism and (b) in the presence of astigmatism, respectively, and FIGS. 4(a-2) and 4(b-2) are diagrams showing a one-dimensional radius vector counting histogram $P(rj)$ obtained from a binary image $B(rj, \theta i)$ (a) in the absence of astigmatism and (b) in the presence of astigmatism, respectively, wherein a threshold level suitably set on the one-dimensional radius vector counting histogram $P(rj)$ is applied for obtaining the upper limit of spatial frequency required when the fitting of $Rave(r)$ to the divided quantity data is carried out by the cross-correlation method;

FIGS. 9(a) through 9(e) shows diagrams in experiments on automation of astigmatism correction, wherein

BEST MODE FOR CARRYING OUT THE INVENTION

Referring to the accompanying drawings, the preferred embodiment of an electron microscope and a method for controlling its focus position according to the present invention will be described below.

The present invention is intended to detect first and second two images at two focus positions, which are realized by changing a predetermined physical quantity only by a known quantity, to compare the detected results with theoretical data to recognize the electron optical state of an electron microscope to automatically adjust its focus position and/or astigmatism. The predetermined physical quantity may be any physical quantity univocally influencing the focus position of the electron microscope. The predetermined physical quantity should not be limited to the focus position, but it may be another physical quantity, e.g., an accelerating voltage of electron beams. In the following descriptions, the focus position itself will be used as an example of a predetermined physical quantity capable of being easily handled, and a focus shifted quantity between two focus positions is used as the known quantity.

Figure 1:
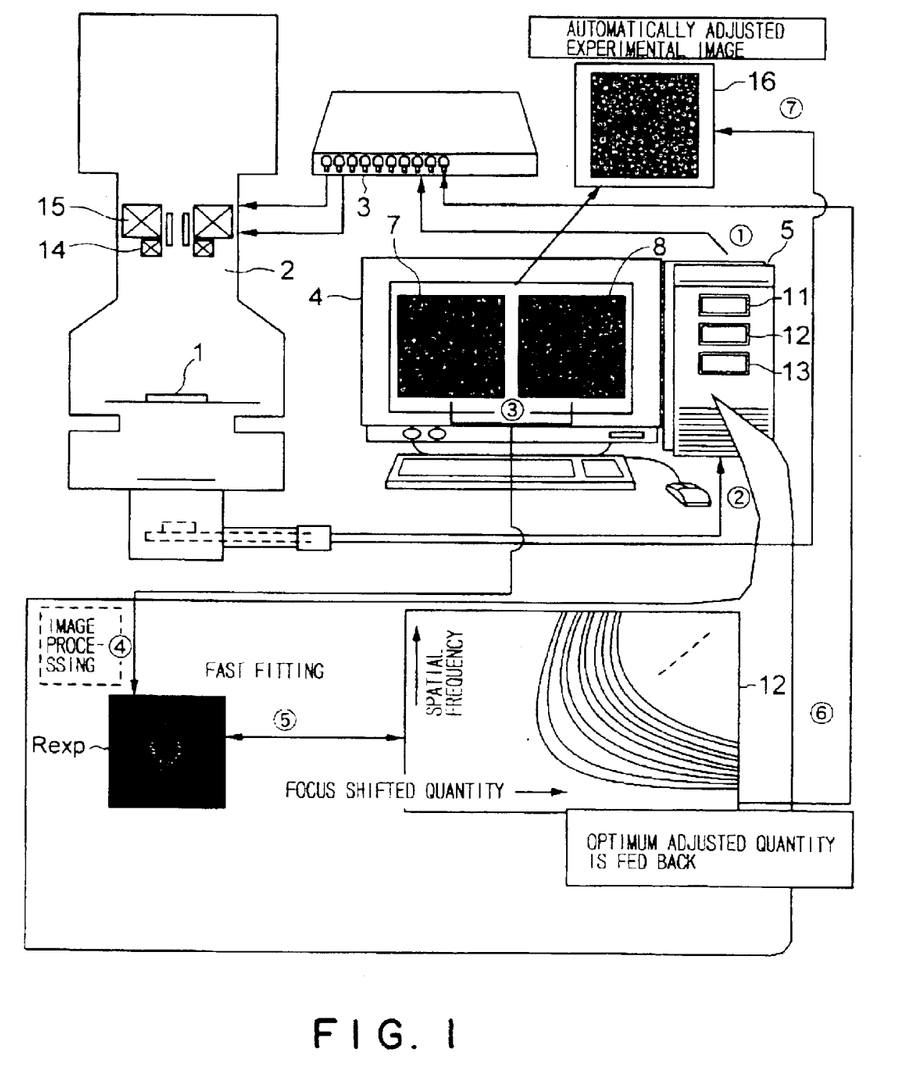
FIG. 1 is a block diagram showing a preferred embodiment of an electron microscope, and a method for controlling its focus position according to the present invention, wherein ①–⑦ show an operating procedure when focusing is carried out.

First, referring to FIG. 1, an electron microscope and a method for controlling its focus position according to the present invention will be schematically described.

As shown in FIG. 1, the electron microscope according to the present invention comprises: an electron optical system 2 for conducting electron beams to a sample 1; a focus control part 3 for controlling a focus position f of the electron optical system 2 with respect to the sample 1; an image detecting part 4 for detecting an image caused by electron beams aimed at the sample 1; a computer 5 for carrying out various operations and controls, and a stigmater 14 for correcting astigmatism.

The computer 5 comprises a first operating means 11 for carrying out the Fourier transform (FFT) (spatial frequency transformation) of each of first and second images 7 and 8 detected by the image detecting part 4 at two focus positions, one of which is a suitably set first focus position f1 and the other of which is a second focus position f2 shifted from the first focus position f1 by a known focus shifted quantity $\Delta f$, to obtain first and second transformed images 9 and 10 to mutually divide the first and second transformed images 9 and 10 on a spatial frequency plane (u,v) to derive a measured divided quantity Rexp indicative of the divided results as a function of a spatial frequency. Herein, u and v denote spatial frequency variables of a rectangular coordinate system.

The computer 5 has divided quantity data 12 which are previously prepared and stored as a function of a focus position and a spatial frequency as a set of theoretical divided quantities K(r;f)/K(r;f+Δf). The theoretical divided quantities K(r;f)/K(r;f+Δf) are obtained by deriving an image transfer function K(r,f) with respect to the electron optical system 2 as a function of a focus position and a spatial frequency, substituting the above described two focus positions, which are shifted by the focus shifted quantity Δf, for the image transfer function K(r,f), obtaining a first transfer function value K(r;f) and a second transfer function value K(r;f+Δf), and mutually dividing the first transfer function value K(r;f1) and the second transfer function value K(r;f+Δf) on the spatial frequency plane (u,v). Herein, r denotes a spatial frequency variable of a polar coordinate system, and $r^2=u^2+v^2$.

The computer 5 further comprises a second operating means 13 for making a reference to the divided quantity data 12 to derive a theoretical divided quantity K(r;f0)/K(r;f0+Δf) wherein functional characteristics with respect to the spatial frequency correlate to the measured divided quantity Rexp, and for deriving a focus position f0 corresponding to the derived theoretical divided quantity (r;f0)/K(r;f0+Δf) as a first focus position f1.

Since the focus control part 3 is capable of deriving the first focus position f1 as an absolute position by the results of operations carried out by the second operating means 13, the focus control part 13 is designed to control an electron lens 15 and so forth of the electron optical system 2 to focus the electron optical system 2 to obtain a clear formed image having an automatically adjusted focus.

The details of the above described contents will be described below.

The present invention is intended to actually detect an electron optical state to use the detected results to automatically adjust the focus position and/or astigmatism, and is capable of automatically adjusting focusing regardless of the presence of astigmatism. The focusing in the absence of astigmatism, and the focusing in the presence of astigmatism (focusing with correction of astigmatism) will be described below.

Figure 2:
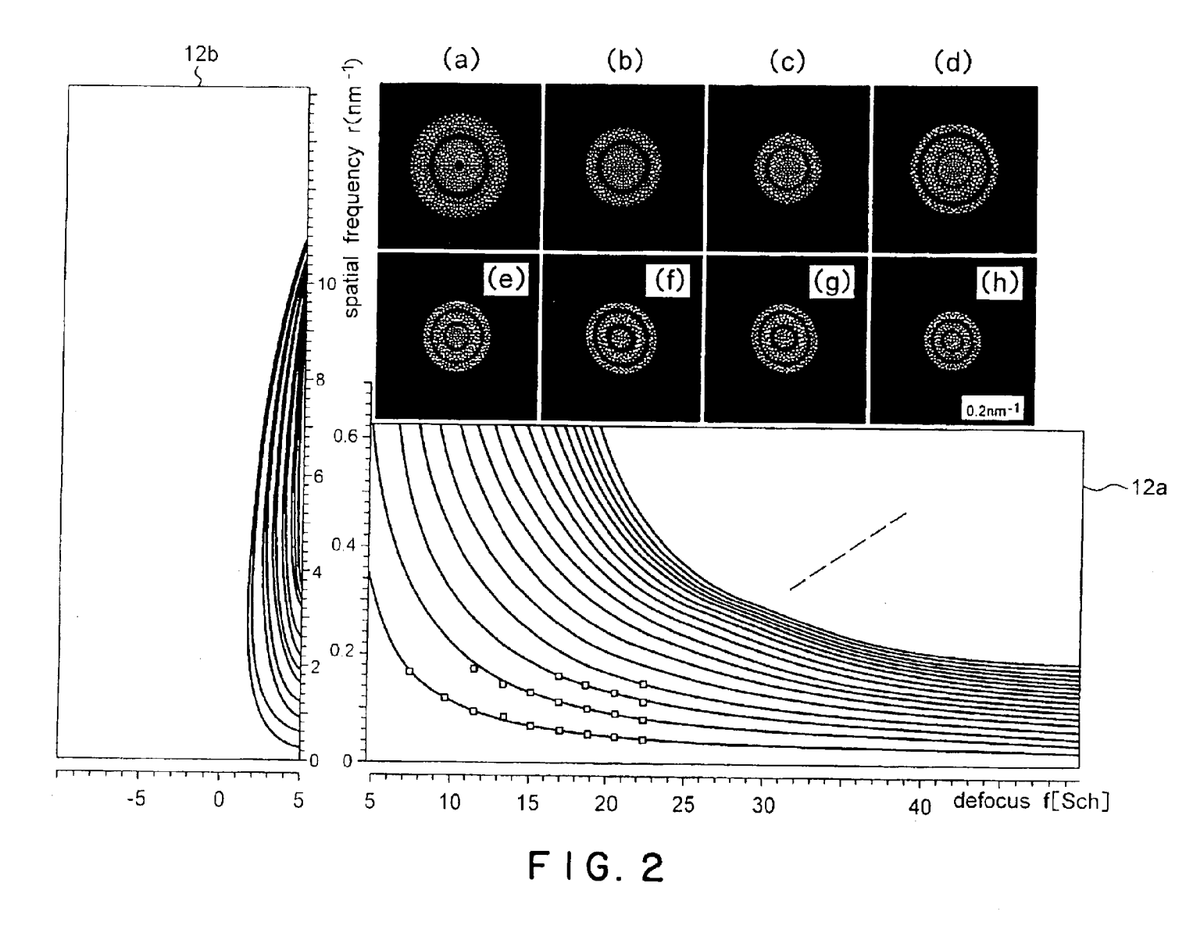
FIG. 2 is an illustration for explaining divided quantity data, wherein (a), (b), . . . , (h) denote $K(r;f)$ at various focus positions f, the divided quantity data being obtained as a set of theoretical divided quantities $K(r;f)/K(r;f+\Delta f)$.

First, referring to FIG. 2, the divided quantity data 12 will be described below.

The transfer function K(u,v) with respect to the electron optical system 2 can be theoretically obtained from the geometry of the electron optical system 2. If the electron optical system 2 has a rotation symmetry, K(u,v;f) can be indicated as K(r;f). In FIG. 2, (a), (b), ..., (h) denote K(r;f) at various focus positions f. Since the electron optical system 2 is axis-symmetric, K(r;f) is indicated as a ring-shaped pattern. Herein, $r^2=u^2+v^2$.

If Δf has been determined, K(r;f+Δf) data are derived from K(r;f) data, so that the theoretical divided quantities K(r;f)/K(r;f+Δf) with respect to the focus position f can be theoretically easily calculated. The divided quantity data 12 is obtained as a set of theoretical divided quantities K(r;f)/K(r;f+Δf) with respect to various focus positions f. In FIG. 2, each of reference numbers 12a and 12b denotes a part of the divided quantity data 12. The axis of abscissas denotes focus positions (focus shifted quantities) f, and the axis of ordinates denotes spatial frequencies r. The divided quantity data 12 has been previously derived as a set of theoretical divided quantities K(r;f)/K(r;f+Δf) with respect to various focus positions f, and has been stored in a memory of the computer 5. Herein, Δf is the same quantity as the focus shifted quantity Δf which is used when a measured divided quantity Rexp is obtained. Since an effective spectral region increases if Δf is not too wide and suitably set, Δf may be set to be about 1 to 2 [Sch].

The measured divided quantity Rexp will be described below.

It is assumed that the first and second images 7 and 8 detected under different electron optical conditions (different focus shifted quantities) are $I_1(x,y)$ 7 and $I_2(x,y)$ 8, respectively. Between the transfer function K(u,v) with respect to the electron optical system 2, and the Fourier transforms $F[I_1(x,y)]$ 9 and $F[I_2(x,y)]$ 10 of the two images $I_1(x,y)$ and $I_2(x,y)$, and the Fourier transform F[O(x,y)] with respect to the sample function O(x,y) of the sample 1, the following expression is established.

$$F[I_{1,2}(x,y)]=F[O(x,y)]\cdot K_{1,2}(u,v) \qquad (1)$$

It should be noted that the measured divided quantity Rexp obtained by carrying out division between the $F[I_1(x,y)]$ and $F[I_2(x,y)]$ does not include the sample function O(x,y) and is expressed by a ratio of the values of the transfer functions K(u,v) at the respective focus positions f1 and f2, as expressed by the following expression.

$$\begin{aligned}Rexp &= F[I_1(x,y)]/F[I_2(x,y)] \\ &= K_1(u,v,f_1)/K_2(u,v,f_2)\end{aligned} \qquad (2)$$

As a result, the measured divided quantity Rexp is expressed by the expression defined only by the electron optical state of the electron optical system 2 without depending on characteristics of various spatial frequencies of various samples 1 themselves.

Referring to FIGS. 3 through 6, the processing procedure for carrying out the adjustment of astigmatism fa, orientation φa of astigmatism, and the focus position (focus shifted quantity) f will be described below. Herein, focusing is carried out by the focus control part 3, and usual astigmatism correction is carried out by the stigmater 14 for correcting astigmatism. Although it does not matter whether the focusing operation by the focus control part 3 or the astigmatism correcting operation by the stigmater 14 is formerly carried out, a case where the focusing operation is formerly carried out will be described below.

Figure 3:
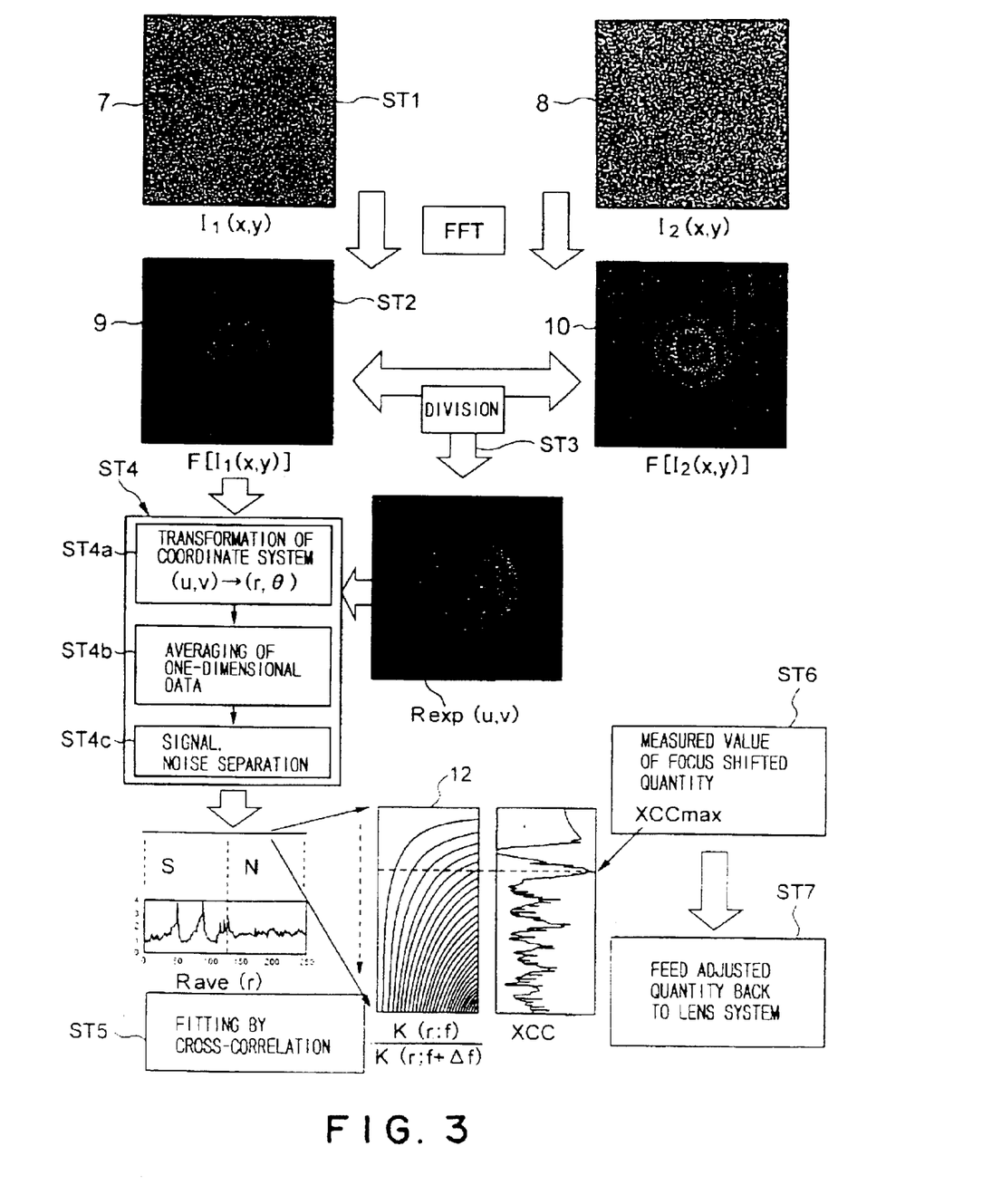
FIG. 3 is a diagram showing an operating procedure when focusing is carried out.

First, at ST1, two STEM images $I_1(x,y)$ 7 and $I_2(x,y)$ 8 are acquired by shifting the focus position by a predetermined focus shifted quantity Δf.

Then, at ST2, the Fourier transform of the acquired image is carried out for obtaining $F[I_1(x,y)]$ 9 and $F[I_2(x,y)]$ 10.

Then, at ST3, division on the spatial frequency plane (u,v) is carried out for obtaining $F[I_1(x,y)]/F[I_2(x,y)]$ (=measured divided quantity Rexp(u,v)).

Then, at ST4, the data processing of the measured divided quantity Rexp(u,v) is carried out.

The step ST4 comprises a step ST4a of carrying out the transformation of coordinate system from (u,v) to (r, θ), a step ST4b of averaging one-dimensional data, and a step ST4c of carrying out a signal-noise separation.

In the data processing at ST4, the operating step of carrying out focusing (correction of astigmatism) in the presence of astigmatism is more complicated than the operating step of carrying out focusing in the absence of astigmatism.

Therefore, in order to facilitate better understanding, the focusing in the absence of astigmatism will be first described.

In the absence of astigmatism, Rexp (u,v) is transformed to Rexp(r, θ) in view of the rotation symmetry of the measured divided quantity Rexp(r, θ), and subsequently, all of radius vector distributions Rexp(r, θ) in discrete directions θi are averaged as shown by expression (3).

$$R_{ave}(r) = \frac{1}{N} \sum_i R_{exp}(r, \theta_i) \qquad (3)$$

As one-dimensional data, Rave(r) is obtained. Herein, N denotes the number of discrete directions θi, and the interval between adjacent discrete directions θi is, e.g., 1 [degree].

Figure 4:
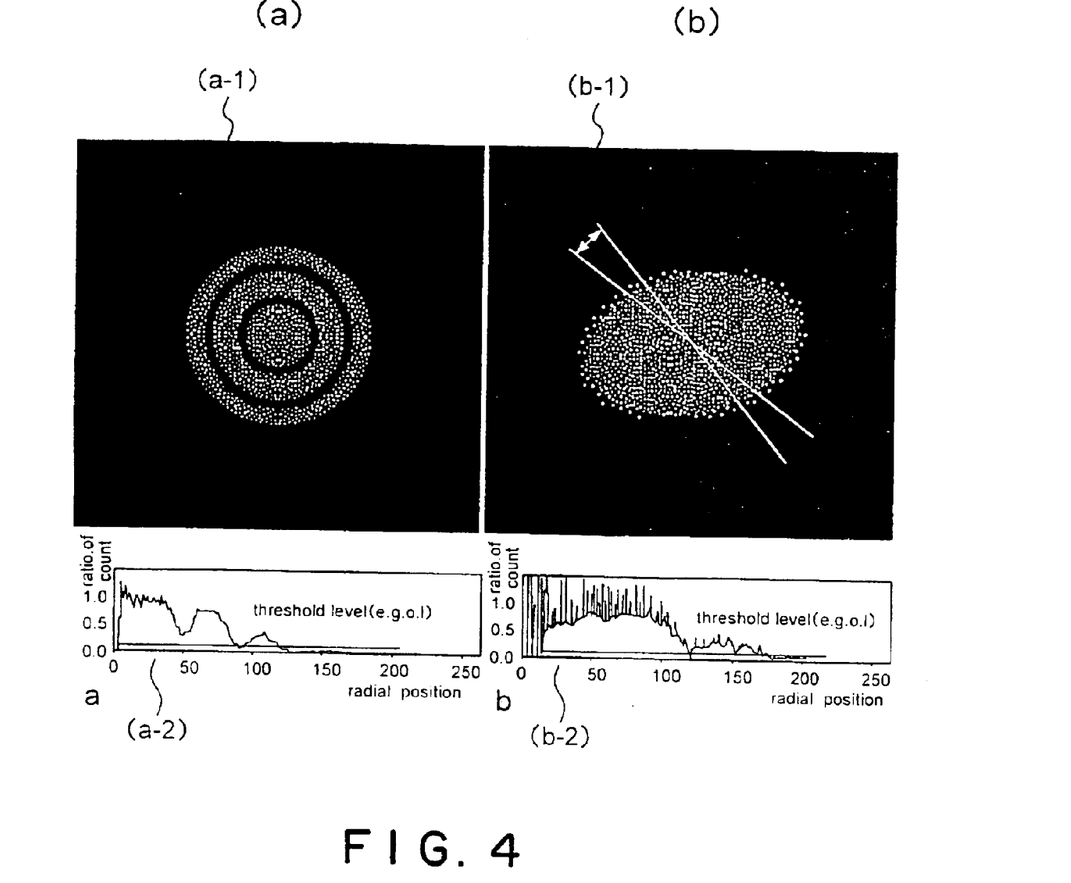
Figure 5:
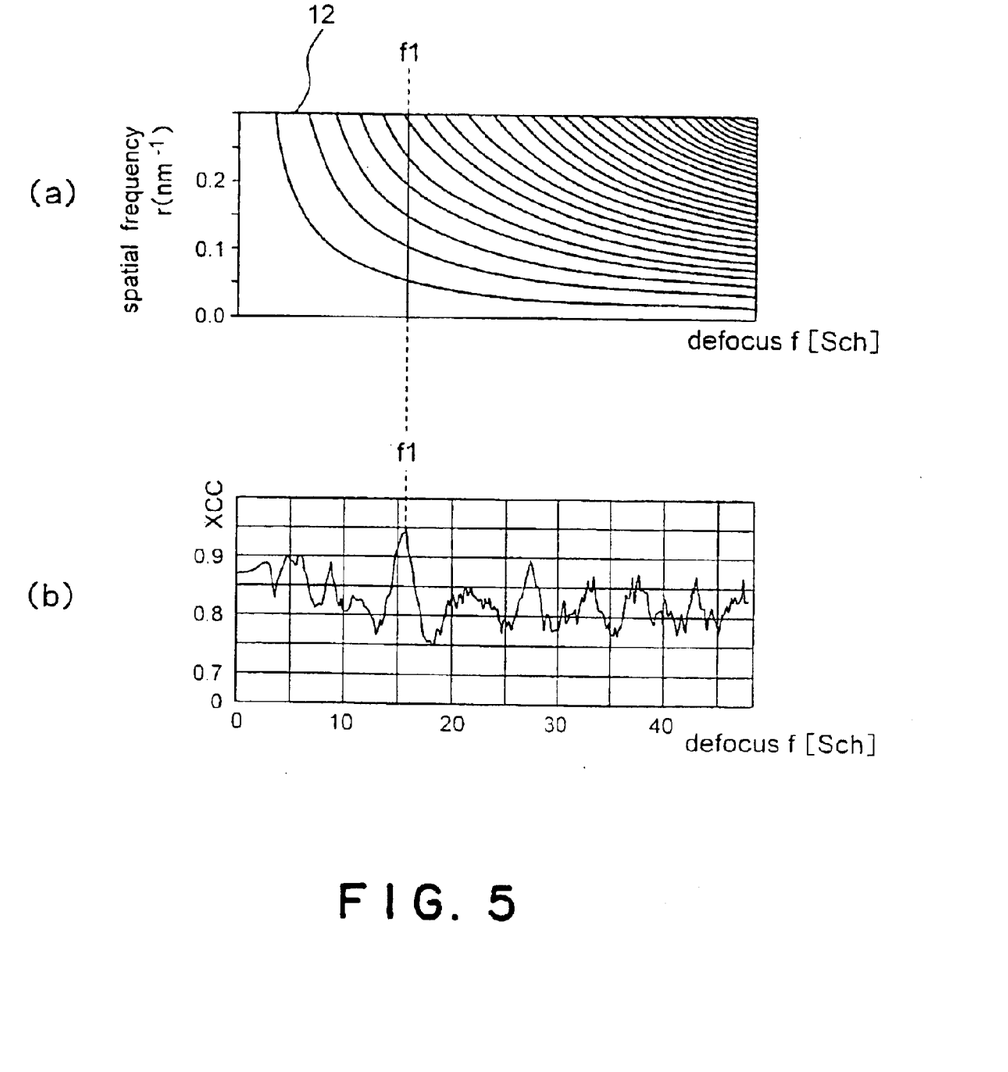
FIG. 5(a) is a graph showing divided quantity data expressed by focus positions f on the axis of abscissas and spatial frequencies on the axis of ordinates.
FIG. 5(b) is a graph showing focus positions f on the axis of abscissas and cross-correlation counts (XCC) on the axis of ordinates when the fitting of $Rave(r)$ to the divided quantity data is carried out by the cross-correlation method, wherein the focus position corresponding to the maximum cross-correlation coefficient (XCCmax) is obtained as a value of a focus position f1 which is best coincident.

Then, at the step ST4 of carrying out the signal-noise separation, the upper limit of the spatial frequency required to carry out the fitting of the Rave(r) to the divided quantity data 12 by the cross-correlation method is obtained as follows. First, binary images B (rj, θi) are prepared by an experimental threshold level to power spectra. In addition, a one-dimensional radius vector counting histogram P(rj) is prepared for them (see FIG. 4(a-2)). Using a higher relative point number than the threshold as a function of a spatial frequency radius (r), this histogram is expressed as follows.

$$P(r_j) = \frac{1}{2\pi r_j} \sum_i B(r_j, \theta_i) \qquad (4)$$

From this histogram, the upper limit of the spatial frequency for coincidence of correlation is estimated by a computer program.

Then, at ST5, the fitting of Rave(r) derived from expression (3) to the divided quantity data 12 is carried out by the cross-correlation method. Then, at ST6, the maximum cross-correlation coefficient (XCCmax) is searched. Thus, the best coincident value of the focus position f1 can be obtained (see FIGS. 5(a) and 5(b)).

Then, at ST7, the quantity of a lens current for moving the focus position to the Scherzer focus position is calculated on the basis of the focus position f obtained at ST6, and this is fed back to this lens system. By the above described steps, the focusing in the absence of astigmatism can be precisely carried out regardless of characteristics of the sample 1.

The automatic focusing in the presence of astigmatism (aberration correction) will be described below.

The transfer function K(u,v) has not been a circular annular pattern, and has been an elliptical annular pattern or a radial pattern. If the pattern is an elliptical ring, the difference fa in astigmatism and the focus position f can be directly obtained by measuring characteristic positions on major and minor axes. The f1 can be obtained by measuring them on an intermediate axis between the major and minor axes. The value of the focus position on the minor axis corresponds to the maximum theoretical divided quantity, the value of the focus position on the major axis corresponds to the minimum theoretical divided quantity, and an average theoretical divided quantity corresponds to the focus position on the intermediate axis.

Figure 6:
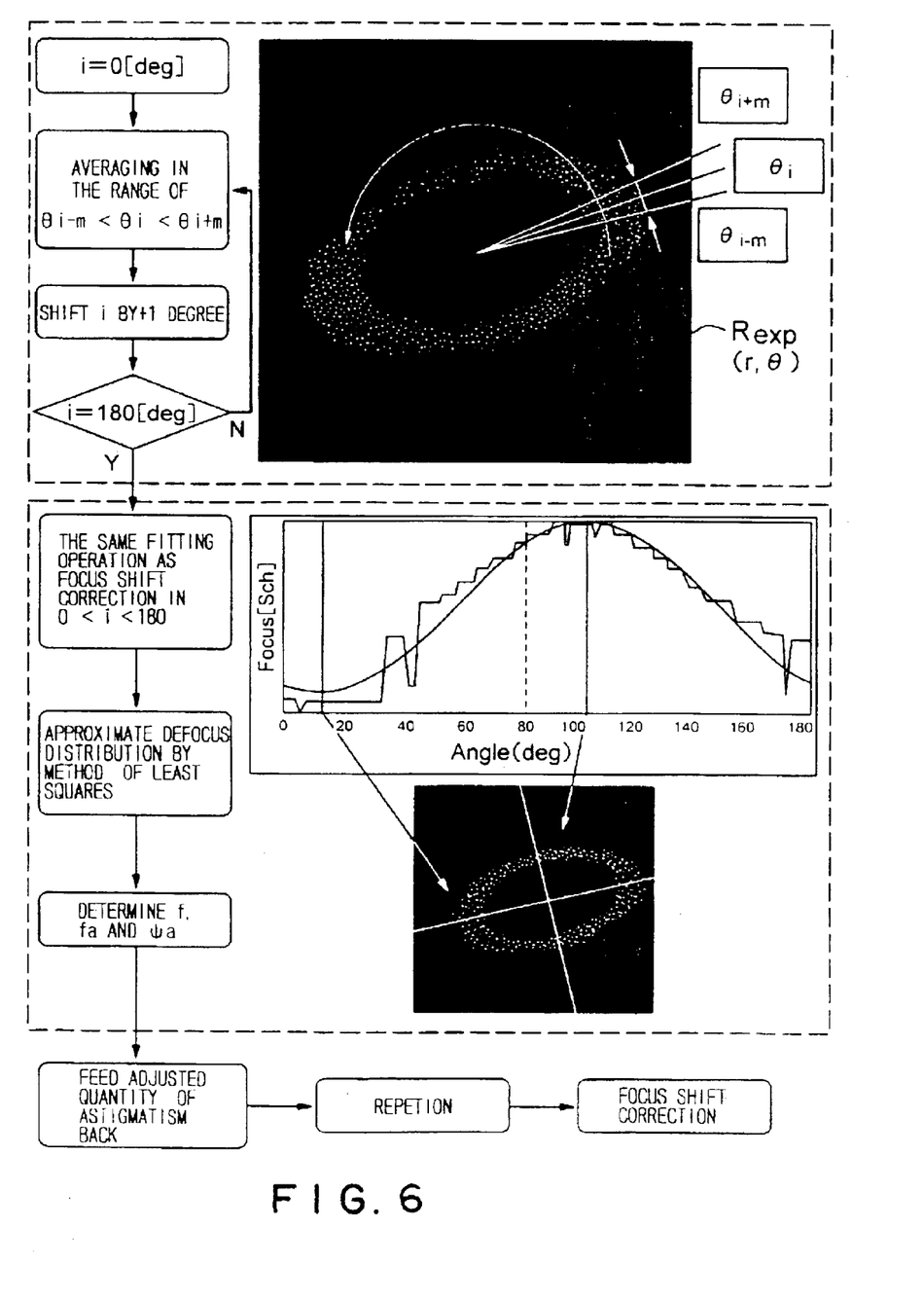
FIG. 6 is a diagram showing an operating procedure when focusing is carried out in the presence of astigmatism.

In the case, the data processing at ST4 is carried out as follows.

The Rexp(u,v) is calculated, and at ST4a, the Rexp(u,v) is transformed to the (r, θ) coordinate system to be Rexp(r, θ). Subsequently, all sets of radius vector distributions Rexp (r, θ) are averaged in a narrow range of discrete direction θi−m<θi<θi+m, and the radius vector distribution in directions of θi is newly expressed by the respective averaged distributions as follows:

$$R_{ave.}(r, \theta_i) = \frac{1}{M} \sum_{k=i-m}^{i+m} E_{exp.}(r, \theta_k) \qquad (5)$$

wherein the number of additional angles from θ+m to θ−m is M. At this time, the additional angle |θ±m| is set to be 9 [deg].

A processing for generating discrete data every angle to separate noise regions is carried out. Since S/N changes every angle, the noise regions must be separated every angle. The separation of signal regions from noise regions is carried out by a simple threshold processing of intensity level of power spectra in the same manner as that in the above described expression (4). The fitting operation by correlation is carried out in the signal region determined by the separation. FIG. 4(b-1) shows a measured divided quantity Rexp in the presence of astigmatism, and FIG. 4(b-2) shows a one-dimensional radius vector counting histogram P(rj) derived with respect to the discrete angular range |θ±m| in FIG. 4(b-1), for obtaining the upper limit of spatial frequency, which is required to carry out the fitting of Rave(r) to the divided quantity data by the cross-correlation method, every discrete angular range |θ±m|.

Then, the fitting operation is carried out by the cross-correlation. When focusing is carried out in the case of only focus shift correction, i.e., in the absence of astigmatism, the fitting operation of the averaged one-dimensional Rave(r, θ) in all discrete orientations to K(r;f)/K(r;f+Δf) of the theoretical model may be carried out as shown in FIG. 3. On the other hand, in the presence of astigmatism, Rave. (r, θi) with respect to each orientation θi is used for carrying out a cross-correlation operation every orientation. Thus, the focus shifted quantity having the maximum correlation coefficient every angle θi measured by the cross-correlation is obtained. It is assumed that this is F(θi). Then, fa, φa and f are measured. In order to enhance reliability, approximation is carried out by the method of least squares. Since F(θi) depends on double symmetric astigmatism, it can be approximated to the expression [f−(fa/2)cos(2θ−φa)]. Therefore, the following equation can be derived.

$$S = \sum_i \left[ F(\theta_i) - f + \frac{fa}{2}\cos(2\theta_i - \varphi_a) \right]^2 \to \min \qquad (6)$$

In this equation, it is not simply possible to mathematically solve the angle φa of astigmatism. However, it can be solved by the numerical calculation since φa exists in the effective range of from 0 to π. If φa is fixed, f and fa can be simply obtained by $$\frac{\partial S}{\partial f} = 0 \text{ and } \frac{\partial S}{\partial (fa/2)} = 0$$

as follows:

$$f = \frac{DB - AC}{NB - A^2}; \qquad (7)$$

-continued $$f_a = \frac{2(AD - NC)}{NB - A^2};$$

$$A = \sum_i \cos(2\theta_i - \varphi_a);$$

$$B = \sum_i \cos^2(2\theta_i - \varphi_a);$$

$$C = \sum_i F(\theta_i)\cos(2\theta_i - \varphi_a);$$

$$D = \sum_i F(\theta_i);$$

wherein N is the number of data of angle θi. Moreover, if θi are given equally at regular intervals from 0 to π (at an interval of 1 [deg] at this time), A=0, and f and fa are expressed by the following simpler expressions.

$$F=D/N; \, fa=-2C/B \qquad (8)$$

By using the above values as f and fa and comparing all of the calculated errors S of least squares while changing φa at fine intervals from 0 to π, φa is obtained. The φa having the minimum error S is the answer. Thus, f, fa and φa are measured.

Then, the quantity of current to be adjusted with respect to each of x and y components in the correction of astigmatism by the stigmater 14 is calculated from the measured values of fa and φa to be fed back to carry out the astigmatism correction.

If necessary, the above described process is repeated several times.

Finally, the final focus correction is fed back so that the corrected focus is the Scherzer focus.

Thus, according to this preferred embodiment, it is possible to carry out focusing regardless of characteristics of the sample 1, so that it is possible to obtain an image wherein astigmatism has been precisely corrected.

Referring to FIGS. 7 through 10, the results of experiments using a practical apparatus will be described below.

The results obtained by repeating experiments by applying a method for controlling the focus position of an electron microscope according to the present invention are shown in FIGS. 7 through 10.

Figure 7:
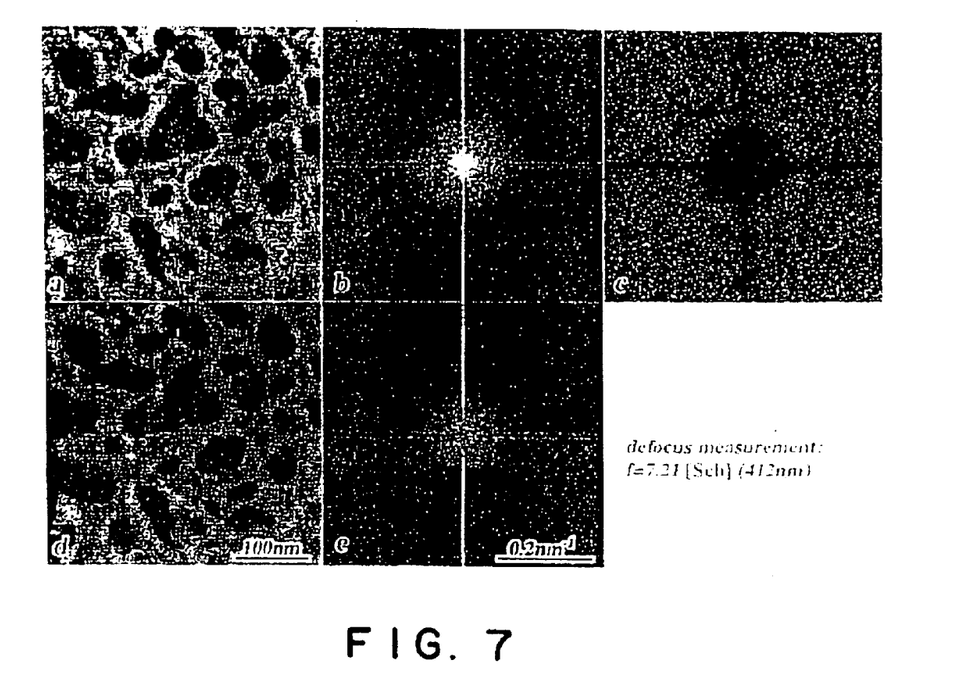
FIGS. 7(a) and 7(d) are two HAADF-STEM images acquired at different focus positions with respect to a thin-film sample of a DRAM being a semiconductor device.
FIGS. 7(b) and 7(e) are diagrams showing power spectra obtained by carrying out the Fourier transform of the images of FIGS. 7(a) and 7(d)
FIG. 7(c) is a diagram showing measured divided quantities Rexp(u,v) obtained by division.
Figure 8:
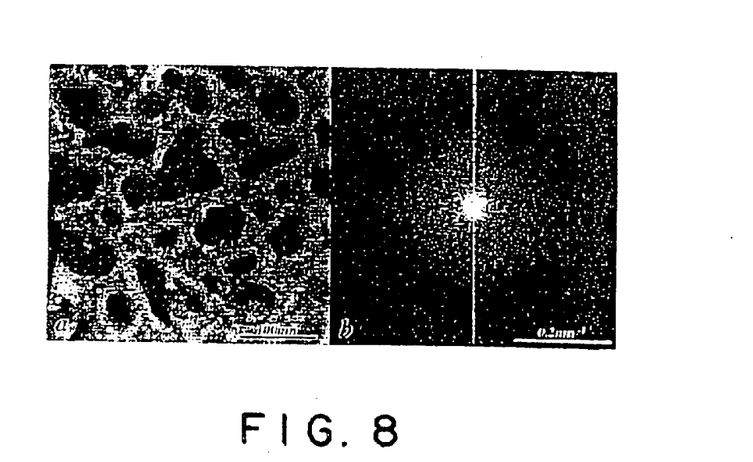
FIG. 8(a) is an HAADF-STEM image after automatic focusing.
FIG. 8(b) is a diagram showing power spectra obtained by carrying out the Fourier transform of the image of FIG. 8(a)

FIG. 7 shows the results of automatic focusing experiments using a thin-film sample of a DRAM being a semiconductor device. First, two HAADF-STEM images (dark-field scanning transmission electron microscope images by a high-angle annular-type detector) were acquired (direct magnification ×60000, 1 [pixel]=5/3 [nm]) (FIGS. 7(a) and 7(d)). Herein,after the first image (FIG. 7(a))was acquired, the focus was changed by Δf (Δf=1.82 [Sch]) to acquire the second image (FIG. 7(b)), and the automatic adjusting method was applied thereto. FIGS. 7(b) and 7(e) show power spectra obtained by the Fourier transform of the images of FIGS. 7(a) and 7(d). FIG. 7(c) shows the measured divided quantity Rexp(u,v) obtained by division.

FIG. 8(a) shows an image after automatic focusing, and FIG. 8(b) shows power spectra obtained by the Fourier transform of the image. Even if such a general sample was used, it was possible to confirm the operation with high reliability.

Figure 9:
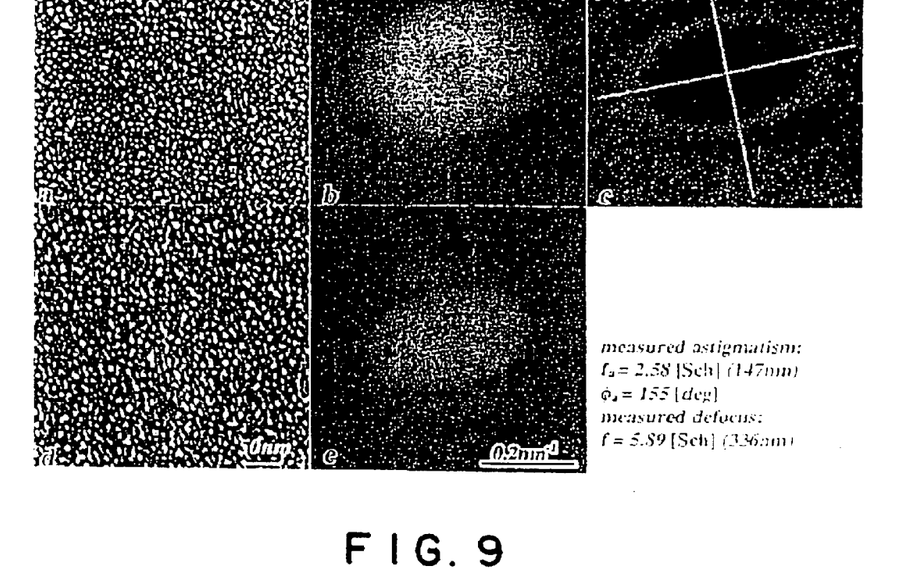
FIGS. 9(a) and 9(d) are two HAADF-STEM images acquired at different focus positions with respect to an Au particle deposited sample on a carbon thin film.
FIGS. 9(b) and 9(e) are diagrams showing power spectra obtained by carrying out the Fourier transform of the images of FIGS. 9(a) and 9(d)
FIG. 9(c) is a diagram showing measured divided quantities Rexp(u,v) obtained by division.
Figure 10:
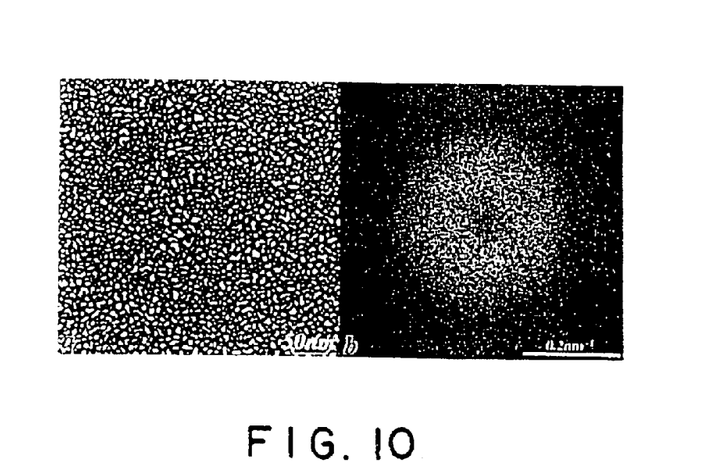
FIG. 10(a) is an HAADF-STEM image after automatic astigmatism correction.
FIG. 10(b) is a diagram showing power spectra obtained by carrying out the Fourier transform of the image of FIG. 10(a).

FIG. 9 shows an experiment on automation of astigmatism correction. In this experiment, an Au particle deposited sample on a carbon thin film having a clear ring pattern as shown in FIGS. 2(a) through 2(h) was used in order to facilitate verification. The image acquiring conditions are the same as those in FIG. 7. After the first image (FIG. 9(a) was acquired, the focus was changed by Δf to acquire the second image (FIG. 9(b)). FIGS. 9(b) and 9(e) show power spectra obtained by the Fourier transform of the images of FIGS. 9(a) and 9(d). FIG. 9(c) shows the measured divided quantity Rexp(u,v) obtained by division. It is observed that crossover lines shown in FIG. 9(c) are coincident with the major and minor axes of an ellipse very well. After the results of the experiment, it was found from the results of calculation that the focus shifted quantity f=5.89 [Sch], astigmatism fa=2.58 [Sch] and the angle ψa=155 [deg].

FIG. 10(a) shows an image after automatic astigmatism correction, and FIG. 10(b) shows power spectra obtained by the Fourier transform of the image. It was found that very good astigmatism correction was carried out.

After the results of the experiments using the practical apparatus, it was validated that the automatic adjusting system can be operated with high reliability in a processing time of several seconds.

From approximating calculations based on the phase contrast transfer function (PCTF) of the transmission electron microscope image (TEM), the following expected precision (Δferror) was calculated and evaluated. It was found that the precision can approach 1 nm.

TABLE 1

| Defocusf [Sch] | \|Δf$_{error}$\| [Sch] (\|Δf$_{error}$\| [nm]) |
|---|---|
| 2 | −0.025 (−1.4) |
| 5 | −0.11 (−6.5) |
| 15 | −0.38 (−22) |

While the scanning transmission electron microscope (STEM) has been described as an example in the above described preferred embodiment, the present invention should not be limited thereto, but the invention maybe applied to a scanning electron microscope or a transmission electron microscope.

While the focus position has been used as an example of a predetermined physical quantity, the present invention should not be limited thereto, but the invention may be applied to another physical quantity, e.g., an accelerating voltage of electron beams, if the physical quantity univocally influences the focal position of an electron microscope.

While the focusing of the electron microscope has been described, the above described technical idea should not be limited thereto, but the idea may be applied to the control of the quantity of astigmatism. In this case, the same technique as that for detecting first and second two images at two focus positions, which are realized by changing a predetermined physical quantity by a known quantity, and comparing the detected results with theoretical data to recognize the electron optical state of the electron microscope to automatically adjust the focus position may be applied for detecting first and second two images by two astigmatism quantities, which are realized by changing a predetermined physical quantity by a known quantity, to compare the detected results with theoretical data to recognize the electron optical state of the electron microscope to automatically adjust the quantity of astigmatism.

As described above, according to the present invention, it is possible to carry out focusing regardless of the presence of astigmatism without depending on characteristics of the sample, and it is also possible to correct astigmatism.

What is claimed is:

1. An electron microscope comprising:
an electron optical system for conducting an electron beam to a sample;
a focus control part for controlling a focus position of said electron optical system with respect to said sample;
an image detecting part for detecting an image caused by said electron beam aimed at said sample;
first operating means for spatial frequency changing each of first and second images, which are detected by said image detecting part at two focus positions of a first focus position and a second focus position which is a focus shifted from said first focus position and which is realized by changing a predetermined physical quantity by a known quantity, to obtain first and second transformed images to mutually divide said first and second transformed images on a spatial frequency plane to derive a measured divided quantity indicative of divided results as a function of a spatial frequency;
divided quantity data previously prepared as a function of focus positions and spatial frequencies as a set of theoretical divided quantities, said theoretical divided quantities being obtained by deriving an image transfer function with respect to said electron optical system as a function of focus positions and spatial frequencies, substituting said two physical quantities, which are shifted from each other by said known quantity, for said image transfer function to obtain first and second transfer function values to mutually divide said first and second transfer function values on a spatial frequency plane; and
second operating means for making a reference to said divided quantity data to derive said theoretical divided quantities, wherein functional characteristics with respect to a spatial frequency correlate to said measured divided quantity, and for deriving a focus position corresponding to the derived theoretical divided quantity as said first focus position,
wherein the focus position of said electron optical system is controlled by said focus control part on the basis of the operated results of said second operating means.

2. An electron microscope as set forth in claim 1, wherein said predetermined physical quantity is a focus position, and said known quantity is a focus shifted quantity between said first and second focus positions.

3. An electron microscope as set forth in claim 1, wherein said first operating means averages said divided results to derive said measured divided quantity as a function of a one-dimensional spatial frequency.

4. An electron microscope as set forth in claim 1, wherein said first operating means divides said divided results into sections of a range of values of spatial frequencies to average them every one of said sections to derive said measured divided value as a one-dimensional spatial frequency every one of said sections, and
said second operating means makes a reference to said divided quantity data to derive said theoretical divided quantity, in which functional characteristics with respect to a spatial frequency correlate to said measured divided quantity, every one of said sections to derive an average theoretical divided quantity of maximum and minimum theoretical divided quantities of the theoretical divided quantities derived every one of said sections, to derive a focus position corresponding to said average theoretical divided quantity as said first focus position.

5. An electron microscope as set forth in claim 4, which further comprises a stigmater for correcting astigmatism, and wherein astigmatism is corrected by said stigmater.

6. An electron microscope comprising:
an electron optical system for conducting an electron beam to a sample;
an astigmatism control part for controlling astigmatism of said electron optical system with respect to said sample;
an image detecting part for detecting an image caused by said electron beam aimed at said sample;
first operating means for spatial frequency changing each of first and second images, which are detected by said image detecting part at two astigmatism quantity of a first astigmatism quantity and a second astigmatism quantity which is an astigmatism quantity shifted from said first astigmatism quantity and which is realized by changing a predetermined physical quantity by a known quantity, to obtain first and second transformed images to mutually divide said first and second transformed images on a spatial frequency plane to derive a measured divided quantity indicative of divided results as a function of a spatial frequency;
divided quantity data previously prepared as a function of astigmatism quantities and spatial frequencies as a set of theoretical divided quantities, said theoretical divided quantities being obtained by deriving an image transfer function with respect to said electron optical system as a function of astigmatism quantities and spatial frequencies, substituting said two physical quantities, which are shifted from each other by said known quantity, for said image transfer function to obtain first and second transfer function values to mutually divide said first and second transfer function values on a spatial frequency plane; and
second operating means for making a reference to said divided quantity data to derive said theoretical divided quantities, wherein functional characteristics with respect to a spatial frequency correlate to said measured divided quantity, and for deriving an astigmatism quantity corresponding to the derived theoretical divided quantity as said first astigmatism quantity,
wherein the astigmatism quantity of said electron optical system is controlled by said astigmatism control part on the basis of the operated results of said second operating means.

7. A method for controlling a focus position of an electron microscope, said method comprising:
a step of conducting an electron beam to a sample;
a first operating step of spatial frequency changing each of first and second images, which are detected by an image detecting part at two focus positions of a first focus position and a second focus position, which is a focus shifted from said first focus position and which is realized by changing a predetermined physical quantity by a known quantity, to obtain first and second transformed images to mutually divide said first and second transformed images on a spatial frequency plane to derive a measured divided quantity indicative of divided results as a function of a spatial frequency, when an image caused by said electron beam aimed at said sample is detected by said image detecting part;
a second operating step of deriving an image transfer function with respect to said electron optical system as a function of a focus position and a spatial frequency, to substitute said two physical quantities, which are shifted from each other by said known quantity, for said image transfer function to obtain first and second transfer function values to mutually divide said first and second transfer function values on a spatial frequency plane, to obtain theoretical divided quantities to make a reference to divided quantity data, which are previously prepared as a function of a focus position and a spatial frequency as a set of said theoretical divided quantities, to derive a focus position corresponding to the derived theoretical divided quantities as said first focus position; and a step of controlling the focus position of said electron optical system by a focus control part, which is provided for controlling the focus position of said electron optical system with respect to said sample, on the basis of the results of operation at said second operating step.

8. A method for controlling a focus position of an electron microscope as set forth in claim 7, wherein said predetermined physical quantity is a focus position, and said known quantity is a focus shifted quantity between said first and second focus positions.

9. A method for controlling a focus position of an electron microscope as set forth in claim 7, wherein said first operating means averages said divided results to derive said measured divided quantity as a function of a one-dimensional spatial frequency.

10. A method for controlling a focus position of an electron microscope as set forth in claim 7, wherein said first operating means divides said divided results into sections of a range of values of spatial frequencies to average them every one of said sections to derive said measured divided value as a one-dimensional spatial frequency every one of said sections, and said second operating means makes a reference to said divided quantity data to derive said theoretical divided quantity, in which functional characteristics with respect to a spatial frequency correlate to said measured divided quantity, every one of said sections to derive an average theoretical divided quantity of maximum and minimum theoretical divided quantities of the theoretical divided quantities derived every one of said sections, to derive a focus position corresponding to said average theoretical divided quantity as said first focus position.

11. A method for controlling a focus position of an electron microscope as set forth in claim 7, wherein astigmatism is corrected by a stigmater.

12. A method for controlling an astigmatism quantity of an electron microscope, said method comprising:

a step of conducting an electron beam to a sample;

a first operating step of spatial-frequency-changing each of first and second images, which are detected by an image detecting part at two astigmatism quantities of a first astigmatism quantity and a second astigmatism quantity, which is an astigmatism quantity shifted from said first astigmatism quantity and which is realized by changing a predetermined physical quantity by a known quantity, to obtain first and second transformed images to mutually divide said first and second transformed images on a spatial frequency plane to derive a measured divided quantity indicative of divided results as a function of a spatial frequency, when an image caused by said electron beam aimed at said sample is detected by said image detecting part;

a second operating step of deriving an image transfer function with respect to said electron optical system as a function of an astigmatism quantity and a spatial frequency, to substitute said two physical quantities, which are shifted from each other by said known quantity, for said image transfer function to obtain first and second transfer function values to mutually divide said first and second transfer function values on a spatial frequency plane, to obtain theoretical divided quantities to make a reference to divided quantity data, which are previously prepared as a function of an astigmatism quantity and a spatial frequency as a set of said theoretical divided quantities, to derive an astigmatism quantity corresponding to the derived theoretical divided quantities as said first astigmatism quantity; and a step of controlling the astigmatism quantity of said electron optical system by a focus control part, which is provided for controlling the astigmatism quantity of said electron optical system with respect to said sample, on the basis of the results of operation at said second operating step.

* * * * *